United States Patent [19]

French

[11] 4,055,813
[45] Oct. 25, 1977

[54] SINGLE ADJUSTMENT MULTIPLE FUNCTION CALIBRATION CIRCUIT

[75] Inventor: Park French, Aurora, Ohio

[73] Assignee: Sterndent Corporation, Mount Vernon, N.Y.

[21] Appl. No.: 696,787

[22] Filed: June 16, 1976

[51] Int. Cl.² ............................................. H03F 1/36
[52] U.S. Cl. .................................... 330/103; 330/99; 330/108; 330/155; 356/188
[58] Field of Search .................. 330/84, 99, 103, 108, 330/155; 358/29; 356/188

[56] References Cited

U.S. PATENT DOCUMENTS 3,719,782   3/1973   Barnum ........................... 179/1 M X

*Primary Examiner*—Lawrence J. Dahl
*Attorney, Agent, or Firm*—Donnelly, Maky, Renner & Otto

[57] ABSTRACT

A single adjustable control is commonly connected with each of a plurality of feedback channels, which are selectively coupled in an amplifier circuit to provide the latter with different basic gains, to adjust the respective basic gains of the amplifier circuit by corresponding fractional or proportional amounts of respective ranges of permissible gain chain for each channel, thereby simultaneously to correct or to calibrate each channel for different amounts of drift of the like.

19 Claims, 3 Drawing Figures

SINGLE ADJUSTMENT MULTIPLE FUNCTION CALIBRATION CIRCUIT

BACKGROUND OF THE INVENTION

The present invention relates generally to gain adjustment circuits for an amplifier and, more particularly, relates to a single or common adjustable control mechanism for an amplifier, which has multiplexed feedback channels to provide the amplifier with different respective gains, to effect for each channel simultaneous linear proportional changes in the effective gains corresponding fractional amounts of the respective ranges of permissible gain change for each.

The gain of a typical feedback stabilized amplifier is normally a function of the impedance ratios in the feedback circuit or channel between the inverting input and output thereof. For purposes of this application the impedances coupled in an amplifier circuit will be considered hereinafter as resistances; however, it will be appreciated that other impedances may be employed equivalently within the spirit and scope of the invention. To change the amplifier gain, then, the ratio of the resistances in the feedback channel may be simply changed.

Moreover, a single amplifier may have a plurality of feedback channels of different respective impedances selectively connected between the amplifier input and output, for example, by conventional multiplexing techniques, selectively to provide the amplifier with different respective basic gains. This multiplexing technique is especially useful when a single amplifier is employed to amplify with different respective gains one or more input signals received on one or more input channels to the amplifier. However, each of those respective feedback channels normally would require separate initial calibration and usually would require subsequent separate calibrations to compensate for circuit fatigue or drift or the like experienced in the input channel or channels, for example, due to changing temperatures, aging, etc. It is, of course, desirable to reduce the amount of time necessary to perform these calibrations in order to increase the available operative time of an instrument employing such an amplifier arrangement.

As a non-limiting example of an instrument employing such a multiplexed amplifier arrangement, a colorimeter may use a single photosensor to detect red, green, and blue light. The electrical output from the sensor for a given intensity of red light impinging thereon may actually be as much or more than ten times the electrical output therefrom for an equal intensity of blue light. Therefore, the gain of the multiplexed amplifier when connected to amplify a signal proportional to measured blue light will preferably be about ten times greater than its gain when so connected for red light, whereby for equal intensities of red, blue and green light, as well, the amplifier output will be about the same. However, the drifting in the amplifier output signals due to temperature, aging or other fatigue of the photosensor, respective amplifier input channels, and/or respective feedback or other color circuits or channels will normally be different for each color; for example, there may be a maximum of say three percent drift experienced in the red color channel, including the photosensor, when measuring red light, between the time the colorimeter is first turned on and a long time, say several hours, later, and similar maximum drifting of say five percent for the green color channel and 1.6 percent for the blue color channel. In the past each color channel would require periodically individual re-calibration to compensate for such drift even though with respect to the mentioned time parameter, for example, for each of the channels the fractional amounts of the maximum possible drift will be approximately the same.

SUMMARY OF THE INVENTION

In the present invention a single adjustable control mechanism is provided for an amplifier to change the basic gain thereof fully over a range of permissible gain change. Preferably the range of permissible gain change as a percentage of the basic amplifier gain is directly proportional to the expected amount of drifting. Therefore, as drifting occurs over a period of time, the adjustable control mechanism may be manually or automatically adjusted to vary the fractional amount of the range of permissible gain change so that the basic gain is in fact changed to compensate for changes due to such drifting.

The single adjustable control mechanism of the invention is especially useful in the described multiplexed amplifier circuits of a colorimeter instrument, for example, that measures plural colors. When the drifting due to time fatigue of each color channel of such instrument is in the same direction and if the amount of expected drifting is known for each channel, then the respective ranges of permissible gain change of each channel may be correspondingly set in the amplifier circuit in accordance with the invention so that subsequent adjustment of the single adjustable control mechanism thereof effects simultaneously respective changes in the basic gains for all feedback channels corresponding fractional amounts of the respective ranges of permissible gain changes to compensate for such drifting whereby linear proportional correction or re-calibration of all channels is achieved.

With the foregoing in mind, it is a primary object of the invention to adjust the gain of an amplifier over a permissible range of change of the basic gain thereof.

An additional object is to provide a single adjustment for an amplifier to obtain linear proportional changes in the gain of the amplifier when each of a plurality of feedback channels are selectively connected to the amplifier.

Another object is to provide for common control of variation in the gains of a multiplexed amplifier having plural feedback channels to effect simultaneously for each channel linear proportional changes in the effective amplifier gains, when connected therewith, corresponding to fractional amounts of the respective ranges of permissible gain changes for each channel.

These and other objects and advantages of the present invention will become more apparent as the following description proceeds.

To the accomplishment of the foregoing and related ends, the invention, then, comprises the features hereinafter fully described and particularly pointed out in the claims, the following description and the annexed drawing setting forth in detail a certain illustrative embodiment of the invention, this being indicative, however, of but one of the various ways in which the principles of the invention may be employed.

DESCRIPTION OF THE PREFERRED EMBODIMENT

Figure 1:
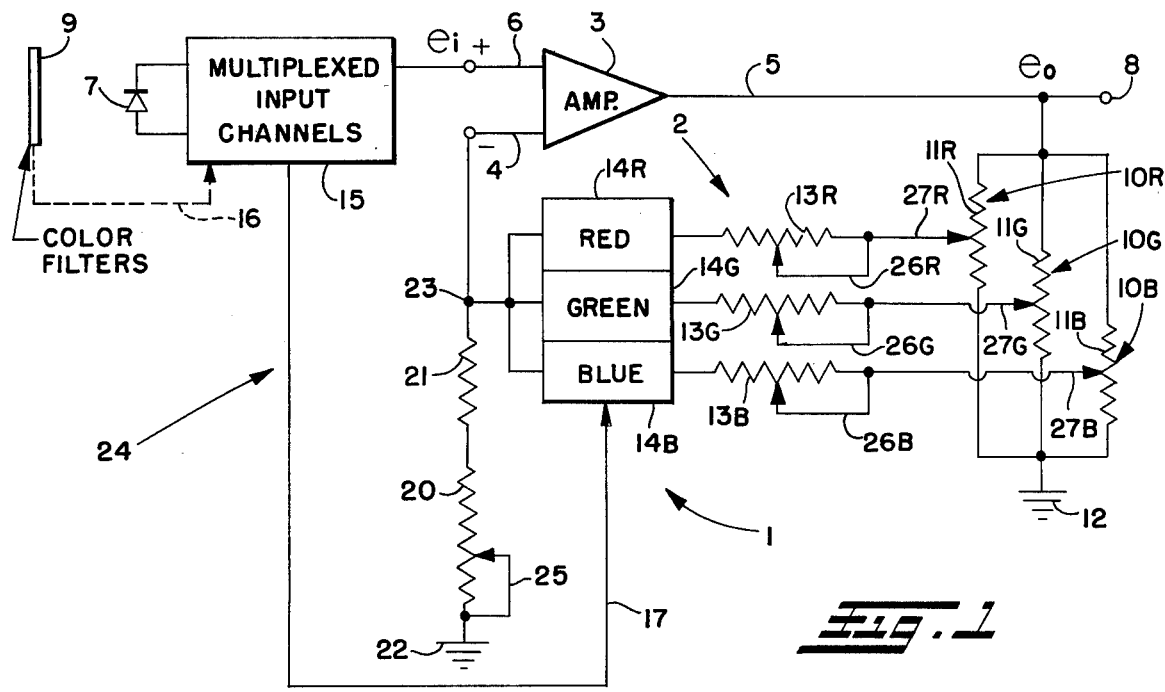
FIG. 1 is a schematic electric circuit diagram of a single adjustment multiple function calibration circuit employing the single adjustable control mechanism of the invention to provide simultaneous linear proportional adjustment of the gain of an amplifier with a plurality of multiplexed feedback channels.

Referring now more particularly to the drawing, wherein like reference numerals designate like elements in the several figures, a single adjustable control mechanism in accordance with the invention is generally indicated at 1 in FIG. 1. The single adjustable control mechanism 1 is included in the feedback circuitry 2 of an amplifier 3 that amplifies input electrical signals $e_i$ supplied at the amplifier input 6 to provide amplified output electrical signals $e_o$ on the amplifier output 5. The amplifier 3 may be a conventional transistorized differential amplifier of very high open-loop gain which has an inverting input 4 connected to the feedback voltage divider as shown. The amplifier 3 in the illustrative embodiment of the invention is employed as part of a circuit in a colorimeter, for example, to amplify input electrical signals $e_i$ that are respectively proportionally representative of the intensities of different colors of lights sensed by a photodetector 7 to provide the output electrical signals at an output terminal 8 which may be coupled to voltage measuring and displaying equipment or the like, not shown, of the colorimeter for visually displaying the intensities of the measured colors.

To sense the intensities of the respective colors, for example, from a lamp, an illuminated sample or reference, or the like, not shown, such a colorimeter may typically include a plurality of color filters, say red, green and blue filters, in a conventional rotating color filter wheel, as is schematically illustrated at 9. Light passing through the respective filters is detected by the sensor 7, which may be a photosensitive silicon diode or other equivalent photosensor, that produces an output that is electrically quantifiable so as to be proportionally representative of the intensity of a given color light impinging thereon. However, the responses of the sensor 7 may be different for lights of equal intensity but of different colors, whereby the input electrical signal $e_i$ for a given intensity of red light impinging on the sensor 7 may be a factor of ten larger than the input electrical signal $e_i$ indicative of an equal intensity of blue light impinging on the sensor 7. Therefore, the feedback circuitry 2 includes a plurality of individual feedback channels 10R, 10G, 10B, the suffixes R, G, B indicating red, green, and blue, respectively, that can be selectively connected between the amplifier input 4 and the amplifier output 5 to change the basic gain of the amplifier so that the output electrical signal $e_o$ representative of a given intensity of red light, for example, detected by the sensor 7 will be approximately the same magnitude as the output electrical signal $e_o$ indicative of equal intensities of blue light and green light detected by the sensor 7.

Moreover, each of the feedback channels includes a respective adjustable voltage divider potentiometer 11R, 11G, 11B, which is coupled between the amplifier output 5 and a ground connection 12 or other source of reference potential, each of which contributes to the adjustability of the basic gain of the amplifier 3 when the respective feedback channels 10R, 10G, 10B are connected thereto. Each of the feedback channels further includes a range adjusting potentiometer 13R, 13G, 13B that are respectively adjustable to determine the ranges of permissible change in the gain provided by the respective feedback channels as percentages of the basic gain. Therefore, as will be described further below, the range adjusting potentiometer 13R, for example, will be employed to assure that the gain of the red feedback channel is adjustable to compensate for up to a maximum of, say, three percent drift simply by adjustment of the single adjustable control mechanism 1. Also, adjustment of the respective range adjusting potentiometers will determine the actual percent change in gain of each channel relative to the others as the mechanism 1 is adjusted.

A plurality of switches 14R, 14G, 14B, such as conventional electronic bilateral gate switches, respectively operatively couple the feedback circuits 10R, 10G, 10B to the amplifier 3 in response to commands from a conventional multiplexing device 15. The multiplexing device 15 includes a connection 16 to the color filter wheel 9 for sensing the position of the latter and thus the color of light impinging on the sensor 7 at any given time and may also include conventional circuitry for developing the input electrical signals $e_i$ as respective electrical potentials proportionally representative of the intensity of light impinging on the sensor. The switches 14R, 14G, 14B are selectively and/or sequentially commanded to closure by signals provided from the multiplexing device 15 via the connection 17. For example, when the red color filter of the color filter wheel 9 is aligned with the sensor 7 to direct red light thereto, the multiplexing device 15 senses that alignment of the color filter wheel and commands closure of the red switch 14R to connect the red feedback channel 10R between the amplifier input 4 and the amplifier output 5, and at the same time the multiplexing device also provides via one of its multiplexed input channels, for example, a direct connection, to the amplifier input 6 an input electrical signal $e_i$ that is proportionally representative of the intensity of the red color light then impinging on the sensor 7. Similar operation of the multiplexing device 15 and the feedback circuitry 2 also will occur preferably automatically as the color filter wheel 9 rotates so that the sensor 7 will sequentially detect green and blue light while the respective green and blue feedback channels 10G and 10B are commanded to connection to the amplifier 3.

The single adjustable control mechanism 1 includes an adjustable potentiometer 20 and a fixed resistor 21 that are series connected between a ground connection or other source of reference potential 22 and a junction 23 of the respective feedback channels 10R, 10G, 10B and the amplifier input 4.

The practical operation of the circuit 24 of FIG. 1 now will be described and the theory of operation will be presented further below with reference to FIGS. 2 and 3. The values of the respective resistances shown in FIG. 1 may be, for example, as follows: voltage divider potentiometers 11 at 5K ohms each; range adjusting potentiometers at 75K ohms each; potentiometer 20 at 25K ohms; and resistor 21 at 50K ohms. The colorimeter instrument would be turned on to energize the overall amplifier circuit 24 and allowed to warm up for a usual period. Then before drift begins to occur, the wiper 25 of the potentiometer 20 is turned to place the full value of that resistance in the circuit and the wipers 26 of the range adjusting potentiometers 13 are turned to place the minimum values of those resistances in the circuit to effect an overall minimum system gain. Light from a neutral color reference material, not shown, is passed to the photosensor 7, and the wipers 27 of the voltage divider potentiometers are adjusted until the output signals $e_o$ from the amplifier 3, for example, as displayed on the colorimeter display, are at satisfactory, and preferably equivalent, magnitudes for each color with respect to the actual known values that should be displayed when such a neutral color reference material is measured by the colorimeter.

After the colorimeter has been on for a relatively long time so that the maximum fatigue and, thus, drifting has occurred in each channel, the wiper 25 of the potentiometer 20, is turned fully to short circuit the resistance of the latter or otherwise to place a minimum resistance thereof in the circuit 24, thereby effectively increasing the gain of the circuit 1. Then the range adjusting potentiometers 13 would be adjusted to bring each of the displayed values of the measured red, green and blue colors, which values, of course, would be proportionally representative of the amplifier output signals $e_o$, back to their respective non-drifted values.

Thereafter, adjustment of only the single potentiometer 20, which comprises the single adjustable control mechanism 1 of the invention, may be employed simultaneously to adjust the gain for all of the channels when non-drifted, partly drifted or fully drifted to facilitate re-calibration. Moreover, as will be described further below, such adjustment of the potentiometer 20 will simultaneously change the gain for each channel corresponding fractional amounts over the respective range of permissible percentage gain change for each channel. Thus, for example, if maximum drifting of the red, green, and blue channels is, respectively, 3%, 5%, and 1.6%, then, after one half of the expected maximum fatiguing and drifting has occurred, the potentiometer 20 may be adjusted to increase simultaneously the gain of the channels, respectively, by 1.5%, 2.5% and 0.8%.

Figure 2:
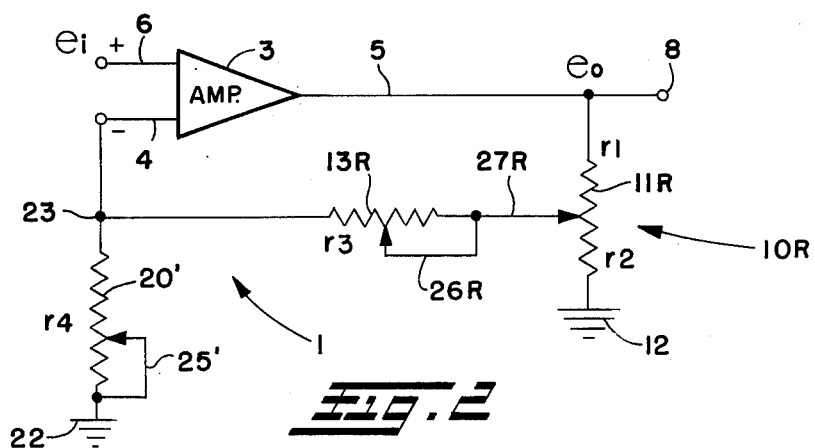
FIG. 2 is a simplified schematic electric circuit diagram similar to the circuit of FIG. 1 but showing only a single feedback channel.
Figure 3:
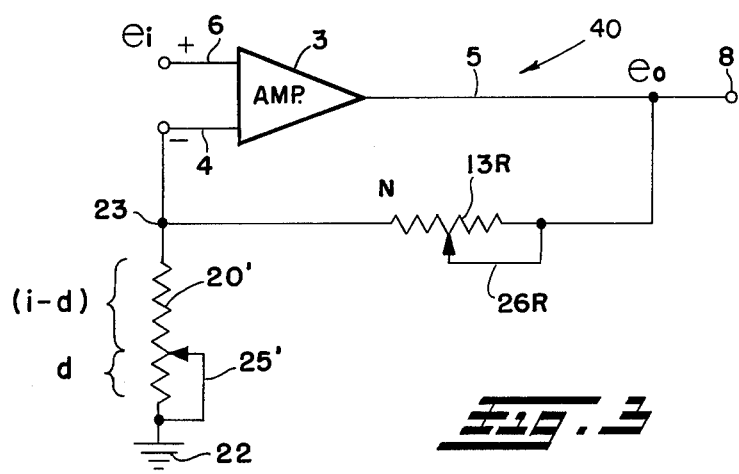
FIG. 3 is an idealized circuit representation of part of the simplified circuit of FIG. 2 to illustrate the principles of the invention.

To facilitate description of the operational theory of the invention reference may be had to FIGS. 2 and 3. In FIG. 2 there is illustrated the amplifier 3 with one of the feedback channels, namely the red feedback channel 10R, connected thereto, as in FIG. 1. In the circuit of FIG. 2, however, the actual values of the resistors are labeled with respective letters, as follows:

$r_1$, the resistance of the potentiometer 11R from the amplifier output 5 to the wiper 27R;

$r_2$, the resistance of the potentiometer 11R from the wiper 27R to the ground reference 12;

$r_3$, the effective resistance of the potentiometer 13R as adjusted by the wiper 26R thereof;

$r_4$, the effective resistance of the potentiometer 20', which comprises a combination of the potentiometer 20 and the resistor 21 of FIG. 1, as adjusted by the wiper 25' thereof.

An input-output circuit equation for the circuit of FIG. 2 can be written as follows:

$$e_i = e_o \frac{r_2}{r_1 + r_2} \cdot \frac{r_4}{r_3 + r_4}, \quad 1)$$

providing that the loading of the voltage divider 11R by the other portions of the feedback channel 10R, namely by elements 13R and 20', be relatively negligible, or, in other words, that the currents normally through $r_1$ and $r_2$, be much larger than current flowing off into $r_3$, so that the fractional percentage gain variation effected by adjusting particularly the potentiometer 20' will be substantially independent of the actual basic channel gain. This condition is obtained when the magnitude of the resistance $r_2$ is much much smaller than the magnitude of $r_3$. This is accomplished by choosing the sum of the resistances $r_1$ and $r_2$ of the potentiometer 11R to be, for example, 5K ohms and by choosing the maximum value of the potentiometer 13R to be, for example, 75K ohms.

With the foregoing inequality condition ($r_2 << r_3$) met, the equation for the gain A of the amplifier 3 with the feedback channel 10R connected thereto can be written as follows:

$$A = \frac{e_o}{e_i} = \frac{r_1 + r_2}{r_2} \cdot \frac{r_3 + r_4}{r_4} \quad 2)$$

Thus, the gain A is a product of two terms, the first of which is related only to the basic gain and the second of which is related to the effective resistance values of the potentiometers 13R and 20'. Moreover, assuming the first such term usually remains relatively fixed after being set mainly by adjustment of the voltage divider potentiometer, then the variations in the second term will effect fractional changes in the basic gain.

Due also to the above inequality, the circuit of FIG. 2 can be simplified further to the form shown in FIG. 3 to illustrate the operation thereof to vary the effective gain of the amplifier 3 by corresponding fractional amounts fully over a range of permissible percent gain change for each channel by adjusting only the potentiometer 20'. In the illustrated circuit 40 of FIG. 3 the values or magnitudes of the resistances have been normalized with respect to that of the full value of the potentiometer 20' to facilitate the following description. Therefore, the normalized full resistance of the potentiometer 20' is 1, i.e. $r_4$ at its maximum value divided by itself, and the normalized value of the potentiometer 13R is N, i.e. $r_3$ divided by $r_4$ at its maximum value. Moreover, "$d$" represents in the following description the value of fractional amount of resistance cut out of the potentiometer 20' by the wiper 25' thereof and "$1-d$" represents the remaining effective value of the potentiometer 20' in the illustrated circuit.

The general gain $A_N$ of the amplifier circuit 40 of FIG. 3 with reference to the various values of N of the potentiometer 13R and the various values of $d$ of the potentiometer 20' is as follows:

$$A_N = \frac{N + (1 - d)}{(1 - d)} \quad 3)$$

Of course, when the potentiometer 20' is at its maximum value whereby $d$ is zero, the gain of the amplifier circuit will be as follows:

4. $A_{N_o} = N + 1$

By dividing equation 3 by equation 4 above, the ratio of the general gain $A_N$ to the gain when $d$ is zero $A_{N_o}$ is obtained as a function of N and $d$, as follows:

$$\frac{A_N}{A_{N_o}} = \frac{N+1-d}{(N+1)(1-d)} \qquad \text{5a)}$$

$$= \frac{N+1-d-dN+dN}{(N+1)(1-d)} \qquad \text{5b)}$$

$$= 1 + \frac{dN}{(N+1)(1-d)} \qquad \text{5c)}$$

By transposing the 1 in equation 5c, the relationship of the normalized change in the gain of the circuit 40 on the left hand of equation 6 is obtained as a product of two separate terms, the first being defined in the value N and the second being defined in the value $d$, as follows:

$$\frac{A_N}{A_{N_o}} - 1 = \frac{N}{N+1} \cdot \frac{d}{1-d} \qquad \text{6)}$$

Equation 6 can be rewritten as equation 7 to represent the fractional normalized change in gain of the circuit 40 as a product of two independent terms that are respectively functions of N and of $d$, as follows:

$$\frac{A_N - A_{N_o}}{A_{N_o}} = \frac{N}{N+1} \cdot \frac{d}{1-d} \qquad \text{7)}$$

Moreover, by multiplying both sides of equation 7 by one hundred percent, the normalized percent change in gain of the amplifier 40 is obtained. It will be seen, therefore, assuming that the value of N is maintained constant in equation 7, then simply by varying the value of $d$, e.g. by adjustment of the wiper 25' of FIG. 3, say between normalized values of zero and one third, the percent change in gain will vary over a range of from zero percent change to one half the maximum possible percent change, which would be determined by the value of N. In other words, since in the present application example the potentiometer 20' is a combination of the 50K ohms resistor 21 and the 25K potentiometer 20 of FIG. 1, the value of $d$ can vary from zero to one third and the value of the term ($d/1$-$d$) in equation 7 can vary from zero to one half.

In view of the foregoing it will be understood that the principles of operation of the normalized circuit 40 may be applied to the circuits of FIGS. 1 and 2 above, assuming that the above inequality remains true. Therefore, referring to FIG. 2, for example, if the value of the potentiometer 13R were set to say 25K ohms, the value of the term (N/N+1) of equation 7 would be $$\frac{\frac{25K}{75K}}{\frac{25K}{75K} + 2} = .25,$$

or, expressed as a percent, 25%. Then, as the wiper 25' of the potentiometer 20' is moved over its full range to vary the $d$ term ($d/1$-$d$), as described above with reference to equation 7, over its range of from zero to one half, the percent change in gain of the amplifier circuit of FIG. 2 will vary correspondingly by from zero percent to 12.5 percent of the basic gain as originally set on the voltage divider potentiometer 11R. Since the value of the $d$ term of equation 7 varies only between zero and one half, the magnitude of the impedance of the range adjustment potentiometers may be maintained relatively large, while effectively defining a relatively small percentage gain variation, in order to maintain the above inequality true so as not to load the voltage divider potentiometers 11, and the relatively large values of the resistor 21 and potentiometer 20 also facilitate this function.

Thus, it should now be clear that by a single adjustment of the wiper 25 of the potentiometer 20 in FIG. 1 from one end of its range, i.e. where it applies all of the resistance thereof to the circuit, and where the respective feedback channels 10R, 10G, 10B are made to provide the amplifier 3 with respective basic gains, to the other end of its range cutting out the resistance of the potentiometer 20 from the circuit, the respective feedback channels are made to provide the amplifier with corresponding gains that are increased by respective percentage amounts. It will also be clear that the actual fractional part of each of those full percentage amounts of permissible gain change, as set on the range adjusting potentiometers 13R, 13G, 13B, by which the basic gain for each channel is actually changed will be the same for each channel and will vary with respect to the setting of the wiper 25 so that the percent change in gain for each channel with respect to the adjustment of the wiper 25 of the single control adjustment 1 of the invention will vary linearly proportionally with respect to the other channels.

Accordingly, the invention provides a singular control that maintains complete separability of the fractional change of each channel, e.g. as a function of the normalized value $d$, from the full range of the percentage gain change for each channel.

Therefore, when the colorimeter instrument has just begun operating with no fatigue or drift, the wiper 25 of potentiometer 20 will be turned down to apply maximum resistance thereof into the amplifier 3 of FIG. 1. Later, after the colorimeter has been running for a while to experience one half its maximum expected fatigue or drift, the single adjustment mechanism 1 is employed by turning the wiper 25, say to increase simultaneously the gains for the respective red, green, and blue channels by, for example, 1.5%, 2.5% and .8%. Further, after the instrument has run to experience approximately maximum fatigue, the wiper 25 may be rotated fully to cut out all of the resistance of the potentiometer 20 thereby to increase the gains of the respective channels to 3%, 5% and 1.6% of their non-drifted values.

It will be appreciated that the various magnitudes applied to the parameters above are only exemplary and that other magnitudes may be substituted within the teachings of the invention. Also, the calibration direction to increase the basic gains as described above is exemplary, and it will be understood that the single adjustable control mechanism 1 of the invention may be similarly employed to reduce the several basic gains.

The embodiments of the invention in which an exclusive property or privilege is claimed are defined as follows:

1. In an amplifier circuit that produces an output electrical signal in response to an input electrical signal and having feedback circuit means for establishing the basic gain of the amplifier circuit, the improvement comprising:

first means coupled to the feedback circuit for determining a limited range of permissible change of the gain of the amplifier circuit as a percentage of such basic gain, and second means coupled to said first means for adjusting the gain of the amplifier circuit over such limited range of permissible gain change from one extremity approximately equal to such basic gain to another extremity.

2. The improvement of claim 1, wherein said second means comprises a first adjustable resistance.

3. The improvement of claim 2, wherein said first means comprises a second adjustable resistance.

4. The improvement of claim 3, wherein the feedback circuit means includes an adjustable voltage divider resistance connected in a series circuit between an output of the amplifier and a reference potential, the voltage divider resistance having an adjustable wiper terminal for setting the basic gain of the amplifier circuit, and wherein said first and second adjustable resistances are connected in the feedback circuit means, said second adjustable resistance normally being of a sufficiently large magnitude relative to that of the portion of the voltage divider resistance coupled between the wiper terminal thereof and such reference potential to avoid substantial loading thereof.

5. The improvement of claim 4, further comprising means for connecting said second adjustable resistance in a circuit between the wiper terminal of the voltage divider resistance and an input of the amplifier circuit, and means for connecting said first adjustable resistance in a circuit between such reference potential and the inverting input to the amplifier circuit.

6. The improvement of claim 5, further comprising additional impedance means in such circuit of said first adjustable resistance and cooperable with the impedance of said second adjustable resistance for further avoiding loading of said voltage divider resistance.

7. In an amplifier circuit that produces output electrical signals in response to respective input electrical signals, including a plurality of feedback circuits and means for operatively connecting the same in the amplifier circuit to provide the latter with respective basic gains, the improvement comprising:

first means coupled to each of the respective feedback circuits for determining respective limited ranges of permissible change of the gain of the amplifier circuit as a percentage of the basic gain thereof when the feedback circuits are respectively connected thereto, and second means operatively connectable to all of said first means for simultaneously adjusting the fractional amount of each of such limited ranges of permissible change that the amplifier circuit gains are changed.

8. The improvement of claim 7, wherein said second means comprises adjustable variable impedance means for simultaneously changing the respective amplifier circuit gains by the same fractional amount of the respective permissible ranges of change.

9. The improvement of claim 8, wherein said adjustable variable impedance means comprises a single adjustable resistance operatively coupled to all of the feedback circuits.

10. The improvement of claim 9, wherein said second means further comprises a fixed resistor in series circuit with said single adjustable resistance.

11. The improvement of claim 9, wherein said first means comprises a plurality of adjustable resistances, each of said plurality of adjustable resistances being connected in a respective one of said feedback circuits.

12. The improvement of claim 11, wherein each of said plurality of feedback circuits comprises an adjustable voltage divider resistance connected in a series circuit between an output of the amplifier and a reference potential, the voltage divider resistance having an adjustable wiper terminal for setting the basic gain of the amplifier circuit when the respective feedback circuit is operatively connected in the amplifier circuit, and wherein said adjustable resistance in said respective feedback circuit is normally of a sufficiently large magnitude relative to that of the portion of the voltage divider resistance coupled between the wiper terminal thereof and such reference potential to avoid substantial loading of the voltage divider resistance.

13. The improvement of claim 12, wherein the means for operatively connecting the feedback circuits in the amplifier circuit includes multiplexing means for selectively and sequentially connecting respective feedback circuits in the amplifier circuit, and wherein each of said adjustable resistances is connectable in a circuit between the wiper terminal of the voltage divider resistance of a respective feedback circuit and an input of the amplifier circuit, and further comprising means for connecting said single adjustable resistance in a circuit between such reference potential and the input to the amplifier circuit.

14. The improvement of claim 13, further comprising an electronic bilateral switch means in each of said feedback circuits for closure in response to control by said means for multiplexing operatively to connect the respective feedback circuits in the amplifier circuit.

15. The improvement of claim 13, further comprising additional impedance means in series circuit with said single adjustable resistance and cooperable with the impedance of the respective adjustable resistances for further avoiding loading of said respective voltage divider resistances.

16. A circuit for adjustably controlling the fractional amounts of permissible ranges of change of the basic gains of a multiplexed amplifier circuit, which has a plurality of voltage divider feedback channels selectively coupled therein to provide the amplifier circuit with different respective basic gains, to compensate the amplifier circuit for different respective amounts of drift or the like, comprising:

variable impedance means coupled in each of said feedback channels for determining the respective permissible ranges of change of the basic gain of the amplifier circuit as a percentage of the basic gain thereof when the respective feedback channels are operatively coupled therein, and single adjustable impedance means operatively connectable to all of said feedback channels for controlling simultaneously the fractional amount of the permissible ranges of change that the basic gain with respect to each feedback channel is changed in response to the magnitude of the impedance of said adjustable impedance means.

17. A circuit as set forth in claim 16, wherein said single adjustable impedance means comprises an adjustable resistance coupled at an input of the amplifier circuit to which the respective feedback channels are also selectively operatively coupled.

18. A circuit as set forth in claim 16, wherein each of said variable impedance means is of a sufficently large magnitude relative to that of the respective voltage divider feedback channel in which it is coupled to avoid loading the voltage divider feedback channel.

19. A circuit as set forth in claim 18, further comprising a fixed resistance connected in series with said single adjustable impedance means and cooperable with said variable impedance means to avoid loading the respective voltage divider feedback channels.

* * * * *